(12) United States Patent
Ishigaki et al.

(10) Patent No.: US 6,268,627 B1
(45) Date of Patent: Jul. 31, 2001

(54) SEMICONDUCTOR DEVICE HAVING IMPURITY REGIONS WITH VARYING IMPURITY CONCENTRATIONS

(75) Inventors: Yoshiyuki Ishigaki; Yasuhiro Fujii, both of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/198,611

(22) Filed: Nov. 24, 1998

(30) Foreign Application Priority Data

Jun. 9, 1998 (JP) .................................. 10-160473

(51) Int. Cl.⁷ .......................... H01L 29/76; H01L 29/94; H01L 31/062; H01L 31/113; H01L 31/119
(52) U.S. Cl. .......................... 257/336; 257/344; 257/408; 257/390; 257/393; 257/365; 257/368
(58) Field of Search ..................................... 257/390, 393, 257/402, 408, 368, 373, 376, 396, 336, 344, 274, 365, 382, 391

(56) References Cited

U.S. PATENT DOCUMENTS

| | | | |
|---|---|---|---|
| 5,625,217 | * | 4/1997 | Chau et al. ............................ 257/412 |
| 5,648,286 | | 7/1997 | Gardner et al. ......................... 437/44 |
| 5,789,787 | * | 8/1998 | Kadosh et al. ......................... 257/369 |
| 5,834,851 | * | 11/1998 | Ikeda et al. ............................ 257/393 |
| 5,894,162 | * | 4/1999 | Paterson et al. ....................... 257/316 |
| 6,020,232 | * | 2/2000 | Gardner et al. ........................ 438/231 |
| 6,025,239 | * | 2/2000 | Yu ......................................... 438/302 |
| 6,027,978 | * | 2/2000 | Gardner et al. ........................ 438/289 |

FOREIGN PATENT DOCUMENTS

| | | |
|---|---|---|
| 196 22 431 | 6/1997 | (DE) . |
| 55-44748 | 3/1980 | (JP) . |
| 2-312271 | 12/1990 | (JP) . |
| 4-061377 | 2/1992 | (JP) . |
| 4-262574 | 9/1992 | (JP) . |

OTHER PUBLICATIONS

"Explanation of Reverse Short Channel Effect by Defect Gradients", C.S. Rafferty, et al., IEDM Tech. Digest (1993), pp. 311–314.

* cited by examiner

Primary Examiner—Eddie Lee
Assistant Examiner—Jesse A Fenty
(74) Attorney, Agent, or Firm—McDermott, Will & Emery

(57) ABSTRACT

In an access transistor formed on a silicon substrate, its drain region is formed of $n^-$ type and $n^+$ type drain regions and its source region is formed of $n^-$ type and $n^+$ type source regions. In a driver transistor, its source region is formed of $n^-$ type and $n^{++}$ type source regions and its drain regions is formed of $n^-$ type and $n^+$ type drain regions. The $n^+$ +type source region is formed deeper than the $n^+$ type drain region. Accordingly, a semiconductor device ensuring improvement in a static noise margin while suppressing increase in manufacturing cost is provided.

8 Claims, 16 Drawing Sheets

SEMICONDUCTOR DEVICE HAVING IMPURITY REGIONS WITH VARYING IMPURITY CONCENTRATIONS

BACKGROUND OF THE INVENTION

1. Field of the Invention

The present invention relates to a semiconductor device, and particularly to a semiconductor device ensuring stable operation of a memory cell.

2. Description of the Background Art

As an example of a conventional semiconductor device, a semiconductor device provided with a static random access memory (hereinafter referred to as an "SRAM") will be described. An SRAM is a volatile semiconductor device, in which memory cells are placed at crossings of complementary data lines (bit lines) and word lines arranged in a matrix. FIGS. 20A and 20B each show an equivalent circuit of the memory cell. Referring to FIGS. 20A and 20B, each memory cell is composed of a flip-flop circuit F and two access transistors A1 and A2. In flip-flop circuit F, one inverter INV1 having a load element L1 and a driver transistor D1 and the other inverter INV2 having a load element L2 and a driver transistor D2 each have its input terminal and output terminal cross-coupled, thereby forming two storage nodes N1 and N2.

Access transistor A1 has a source region connected to storage node N1, and a drain region connected to one of the complementary bit lines. Similarly, access transistor A2 has a source region connected to storage node N2, and a drain region connected to the other bit line of the complementary bit lines. Driver transistor D1 has a drain region connected (commonly) to the source region of access transistor A1, and a source region connected to a ground line $V_{EE}$. The gate electrode of driver transistor D1 is connected to the source region of access transistor A2.

Driver transistor D2 has a drain region connected (commonly) to the source region of access transistor A2, and a source region connected to ground line $V_{EE}$. The gate electrode of driver transistor D2 is connected to the source region of access transistor A1. One end of load element L1 is connected to the source region of access transistor A1, and the other end to a power supply line ($V_{CC}$ line). Similarly, one end of load element L2 is connected to the source region of access transistor A2, and the other end to power supply line ($V_{CC}$ line).

Gate electrodes of access transistors A1 and A2 are connected to a word line (WL), which controls conduction of access transistors A1 and A2. Storage nodes N1 and N2 have two stable states in which the voltage of one storage node is at a high level and that of the other node is at a low level, or vice versa. This is called a bistable state, and the memory cell will be kept at this bistable state as long as a prescribed power supply voltage is applied thereto.

The operation of the SRAM will now be described. Firstly, when writing data into a specific memory cell, a word line (WL) corresponding to the memory cell conducts access transistors A1 and A2, and forcefully applies a voltage to a pair of the complementary bit lines according to a desired logic value. The potentials of the two storage nodes N1 and N2 of flip-flop circuit F is thus set to the above-described bistable state, with data kept as the potential difference.

For data reading, access transistors A1 and A2 are rendered conductive, the potentials of storage nodes N1 and N2 are transmitted to the bit lines, whereby data are read out.

Next, input/output transfer characteristics indicating the performance characteristics of the above memory cell will be described with reference to drawings. Firstly, FIG. 21 shows the input/output transfer characteristics of a pair of inverters shown in FIG. 20B. In FIG. 21, the ordinate represents the potential of storage node N2, and the abscissa represents the potential of storage node N1. Curved lines C and C1 show correlations of the inputs and outputs of the pair of inverters. In order for the inverters to function as a flip-flop circuit, curved lines C and C1 need to have two intersections, i.e., two stable points S1 and S2. Particularly, a memory cell must be designed to have a sufficiently large area surrounded by curved lines C and C1 to stand up to practical use. Here, the diameter of a circle inscribed in curved lines C and C1 is used as an indicator, as shown in FIG. 21. Specifically, the diameter of this circle is called a static noise margin (SNM).

Next, FIG. 22 shows the input/output transfer characteristics of the memory cell at standby. As access transistors A1 and A2 are not conductive at standby, driver transistors D1 and D2 and load elements L1 and L2 form respective inverters of the memory cell. At this time, load elements L1 and L2 have relatively high impedance, whereby the inverter outputs make steep transitions. Therefore, in this case, the static noise margin is relatively large, enabling the data to be kept stably.

Next, FIG. 23 shows the input/output transfer characteristics of the memory cell at data reading. When reading data out of the memory cell, access transistors A1 and A2 are rendered conductive, so that a column current flows into the storage node at a low level. This results in a condition equivalent to that in which a load with a relatively low impedance is connected in parallel to the load element. Thus, load elements L1 and L2 with high impedance function as if they did not exist. The inverters are therefore regarded as NMOS enhancement type ones with the access transistors serving as a load. The relation of the inputs and outputs of the inverters at this time is expressed as curved lines C and C1, from which it is understood that the inclination of the transition at the inverter outputs is more gentle when it is compared in particular to the inverter outputs at standby. This means that the gain of the inverters at this time is lower than that at standby.

FIG. 24 shows the input/output transfer characteristics of the memory cell at writing data. In the memory cell into which data are to be written, access transistors A1 and A2 are rendered conductive, and the voltage of one of the complementary bit lines is lowered closer to a ground potential (which is called "to pull down") to set the potential of the storage node at a low level.

This will be explained with reference to FIG. 24. Suppose that the memory cell is initially stabilized at S2, i.e., (N1, N2)=("L", "H"). In order to rewrite this data to an opposite data, i.e., (N1, N2)=("H", "L"), the voltage of the bit line connected to access transistor A2 is pulled down. This results in the change of the input/output transfer characteristics of one of the inverters, which have storage node N1 as an input and storage node N2 as an output, from that as expressed by curved line C1 to that as curved line C2. Here, there is only one stable point S1', offering a monostable state, and thus the data is rewritten. When pulling down is stopped to quit data writing, the inverter outputs make transitions to cross point S1 and are stabilized.

In conventional semiconductor devices, several approaches have been taken to attain stable operation of a memory cell in the above-described SRAM. For example, Japanese Patent Laying-Open No. 4-61377 describes an approach to set the threshold voltage of a driver transistor higher than the threshold voltage of an access transistor. That is, the threshold voltage of the access transistor is set even lower.

This will now be described. Especially when reading data, the potential of the storage node at a high level lowers from the power supply voltage at standby to the power supply voltage minus the threshold voltage of an access transistor, causing a static noise margin temporarily lowered considerably at times. Here, if the inverters do not have a sufficient static noise margin, the bistable state will be lost and thus data will be destructed. In order to prevent this from occurring, the threshold voltage of the access transistor is normally kept low to increase the static noise margin of the inverters, and thus stable operation of the memory cell is ensured.

Immediately after a writing operation, the potential of the storage node at a high level rises no more than the power supply voltage minus the threshold voltage of the access transistor, making data vulnerable to external noise and α-rays. This problem becomes more serious as the voltage is lowered according to the current trend for lower power supply voltages. In view of this, also, lower threshold voltage of the access transistor is advantageous since it ensures a higher power supply voltage, thereby suppressing such data destruction and permitting stable operation of the memory cell.

Herein, a soft error caused by the α-rays will be described. The incidence of the α-rays into the storage node at a high level in the memory cell causes electron-hole pairs to generate along the range of the α-rays. In the depletion layer, electrons out of the electron-hole pairs are attracted to the storage node due to the electric field, which leads to reduction in the potential of the storage node at a high level. The flip-flop current is thus inverted, thereby destructing data. This event is called the α-ray induced soft error.

In an attempt to increase the static noise margin of an inverter, there has been a method of setting the resistance at the grounded side (connected to the ground line) of the driver transistor as low as possible to stabilize the ground potential. For example, Japanese Patent Laying-Open No. 2-312271 describes a semiconductor device in which a titanium silicide film is formed on the surface of the source region (corresponding to the grounded side) of the driver transistor to lower the resistance at the grounded side. Herein, stabilizing the ground potential means to minimize the potential rise from the 0 V level when a current flows.

As another way of increasing the static noise margin, there has been a method for increasing the ratio of the current drivability of a driver transistor to the current drivability of an access transistor (i.e. the β ratio). The increase of the β ratio leads to the increase of the inverter gain, so that the operation of the memory cell becomes stable. For the purpose of increasing the β ratio, the gate width of the driver transistor is normally set to be greater than the gate width of the access transistor. Setting the gate width greater, however, hinders reduction in the space occupied by a memory cell region, and therefore a higher degree of integration of a semiconductor device cannot be attained easily.

As such, another method of increasing the β ratio by providing the driver transistor with a greater current drivability has been currently adapted. As an example, one of such methods increases the current drivability of the driver transistor by setting higher the impurity concentration of the source-drain regions of the driver transistor to reduce the parasitic resistance.

As a still another method of increasing the static noise margin, there has been a method of setting the threshold voltage of the driver transistor still higher. At standby, access transistors are not conductive, and therefore the inverters of a memory cell are formed by respective driver transistors D1 and D2 and load elements L1 and L2. At this time, in the inverter having a storage node at a high level, if the sub-threshold leakage current of the driver transistor is the same as or larger than the current flowing through the load element, a current will flow from the storage node through the driver transistor to the grounded side, and the high level cannot be held. Therefore, the threshold voltage of the driver transistor is, desirably, to be set higher so as to reduce the sub-threshold leakage current.

As described above, in order to increase the static noise margin of the inverters in a semiconductor device, it is preferable that the threshold voltage of an access transistor is set lower, the threshold voltage of a driver transistor is set higher, and the threshold voltage of the driver transistor is set higher than the threshold voltage of the access transistor. A threshold voltage of a transistor is controlled by introduction of a prescribed amount of impurities into a semiconductor substrate. Therefore, in order to attain the above-described relation of the threshold voltages, it is necessary to set the impurity concentration at a region in a semiconductor substrate directly below the gate electrode of the driver transistor higher than that of the access transistor.

However, in order to form regions with different impurity concentrations directly below the respective gate electrodes of the access transistor and the driver transistor on a single semiconductor substrate, a mask must be provided when infusing impurities into such regions beneath the respective gate electrodes. A photoresist pattern is used as such an implant mask, and the need for a new mask possibly increases manufacturing cost.

Further, miniaturization of semiconductor devices has caused innegligible misalignment in terms of patterning the above-described photoresist. This results in fluctuation of threshold voltage of transistors, e.g., the rise of the threshold voltage of an access transistor, making it difficult to attain stable operation of a semiconductor device.

Moreover, suppose that the above-described method for increasing the current drivability of a driver transistor is taken in an attempt to increase the static noise margin of an inverter. When, for example, the impurity concentrations of both the source and drain regions of the driver transistor are set higher than the impurity concentration of the drain region of the access transistor, the effective gate length of the driver transistor can become too short. This may cause punch through in the driver transistor, and thus again, it becomes difficult to attain stable operation of the semiconductor device as desired.

SUMMARY OF THE INVENTION

The present invention is made to solve the above-described problems, and its object is to provide a semiconductor device ensuring stable operation, by improving a static noise margin and suppressing a punch through, while preventing increase of manufacturing cost.

A semiconductor device according to one aspect of the present invention includes a first conductivity type region, a first impurity region of a second conductivity type, a second impurity region of a second conductivity type, a third impurity region of a second conductivity type, a fourth impurity region of a second conductivity type, a first gate electrode, a second gate electrode, and a fifth impurity region of a second conductivity type. The first conductivity type region is formed on the main surface of a semiconductor substrate. The first, second and third impurity regions of the second conductivity type, each having a first impurity concentration, are formed on the main surface of the first conductivity type region, spaced apart from one another. The fourth impurity region of the second conductivity type, which is deeper than the third impurity region and having a second impurity concentration higher than the first impurity concentration, is formed on the main surface within the third impurity region. The first gate electrode is formed at a portion on the surface of the first conductivity type region located between the first and second impurity regions, with a gate insulating film interposed. The second gate electrode is formed, with a gate insulating film interposed, at a portion on the surface of the first conductivity type region located between the second and third impurity regions. The fifth impurity region of the second conductivity type is formed on the main surface within the first impurity region, which is deeper than the second impurity region and having a third impurity concentration higher than the second impurity concentration.

According to this structure, one MOS transistor including the first gate electrode and the first, fifth, and second impurity regions is first formed, and another MOS transistor including a second gate electrode and the second, third, and fourth impurity regions is also formed. The fifth impurity region of the one MOS transistor has a higher impurity concentration than and is formed deeper than the second impurity region of the other MOS transistor. Accordingly, the threshold voltage of the one MOS transistor can be set higher than that of the other MOS transistor by a reverse short channel effect which is attributable to the diffusion of point defects that will occur in the semiconductor substrate when forming impurity regions. This can also prevent punch through in the one MOS transistor.

Furthermore, the fifth impurity region of the one MOS transistor has a third impurity concentration which is the highest among others and is formed deeper than the first to fourth impurity regions, and thus has a decreased resistance. Accordingly, an increased amount of current flows through the fifth impurity region, whereby the current drivability of the one MOS transistor is increased. Consequently, the β ratio, or the ratio of the current drivability of the one MOS transistor against the current drivability of the other MOS transistor is increased.

Moreover, the second impurity region of the other MOS transistor has a first impurity concentration which is the lowest compared to the others, and is relatively shallow in depth, and thus the amount of a current flowing through the second impurity region is small. Accordingly, the current drivability of the other MOS transistor is lowered, whereby the β ratio is increased. As a result, the static noise margin of the semiconductor device is improved, ensuring its stable operation.

In addition, the threshold voltages of the one MOS transistor and the other MOS transistor are controlled, for example, by the impurity concentrations of the impurity regions. Accordingly, compared to the case in which the threshold voltages of the MOS transistors are controlled by selectively introducing prescribed impurities into the channel regions of the MOS transistors, there is no need for an additional process step, and thus the increase of the manufacturing cost can be suppressed.

Preferably, the semiconductor device includes a conductive layer formed on the surface of the fifth impurity region.

With such a structure, the resistance at the fifth impurity region is further reduced, its potential is made stable, and thus the current drivability of the one MOS transistor is improved. This leads to increased β ratio, and hence increased static noise margin of the semiconductor device.

The conductive layer is preferably a metal silicide film.

In this case, the film can readily be formed on the surface of the fifth impurity region by causing a metal film to react with silicon within the semiconductor substrate.

Preferably, the semiconductor device further includes a sixth impurity region of a second conductivity type formed on the main surface in the second impurity region, having a fourth impurity concentration which is higher than the first impurity concentration and lower than the third impurity concentration, and a depth greater than that of the second impurity region and smaller than that of the fifth impurity region.

In this case, it is possible to relax the electric fields in the vicinity of the regions directly below the respective sidewalls of the first and second gate electrodes, while keeping the threshold voltage of the one MOS transistor higher than that of the other MOS transistor.

Preferably, the semiconductor device includes a static memory cell having a flip-flop circuit, which is formed of a pair of driver transistors with their gates and drains crosscoupled and load elements each connected between the drain of the respective driver transistor and a power supply, and access transistors, each connected between the drain of the respective driver transistor and one of a pair of bit lines and having a gate connected to a word line. In the access transistor, its drain region is formed of the third and fourth impurity regions, its source region includes the second impurity region, and its gate is the second gate electrode. In the driver transistor, its drain region includes the second impurity region, its source region is formed of the first and fifth impurity region, and its gate is the first gate electrode.

With such a structure, the threshold voltage of the driver transistor in the static memory cell can be set higher than that of the access transistor, and the current drivability of the driver transistor is improved. This leads to the increase of the β ratio and hence of the static noise margin. As a result, stable operation of the memory cell is ensured.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
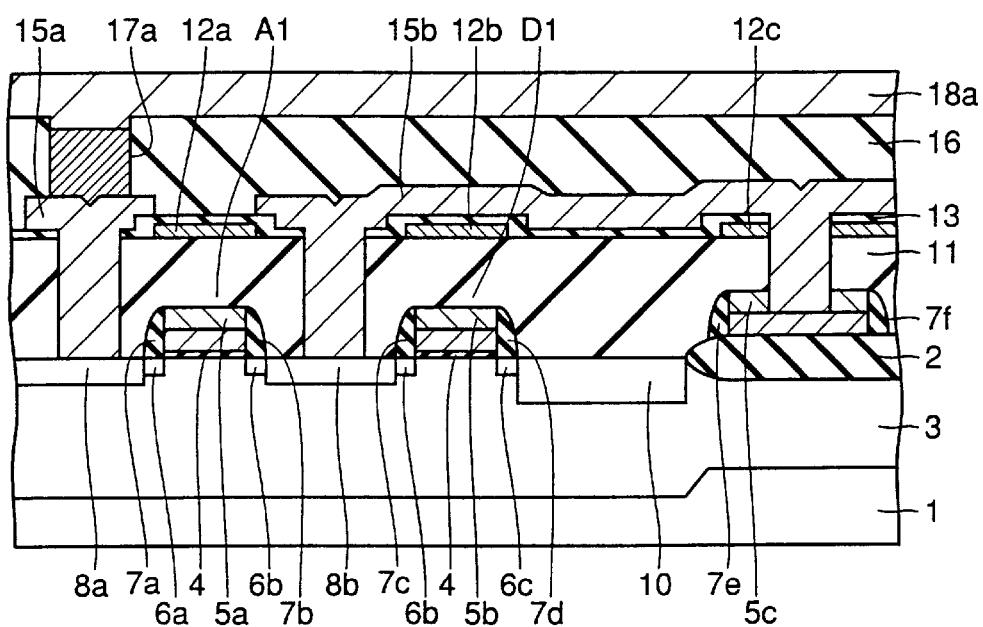
FIG. 1 is a cross sectional view of a semiconductor device according to a first embodiment of the present invention.
Figure 2:
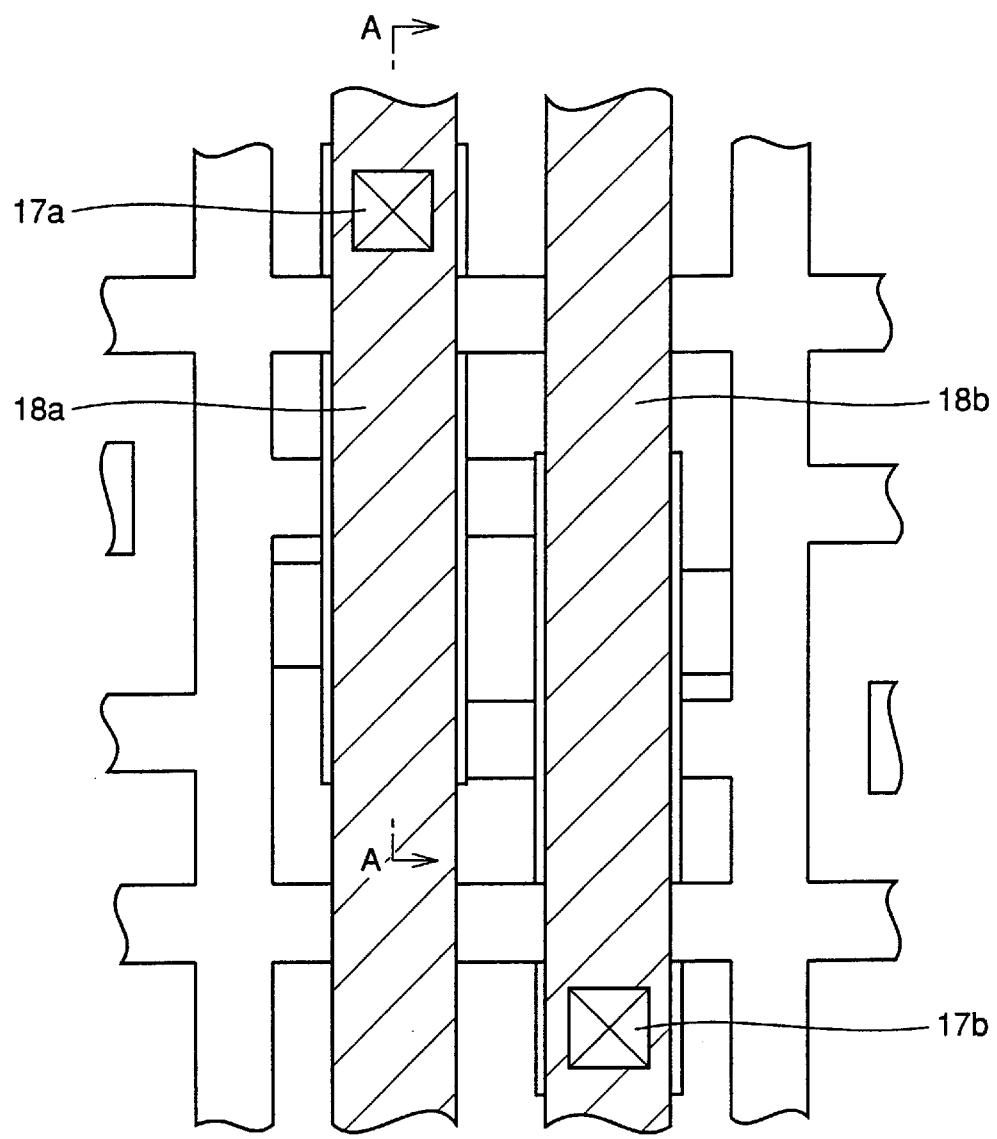
FIG. 2 is a top plan view of the semiconductor device shown in FIG. 1.
Figure 20A:
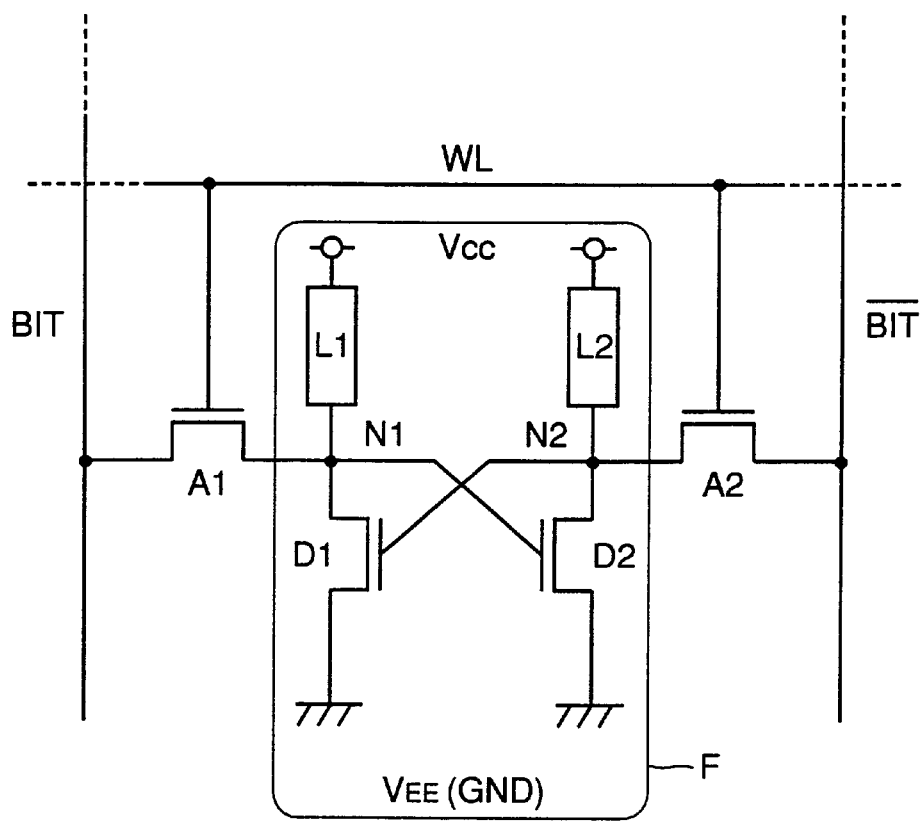
FIG. 20A shows an equivalent circuit of a memory cell in a conventional SRAM.
Figure 20B:
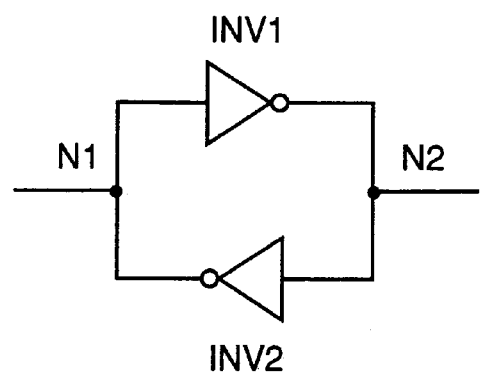
FIG. 20B shows an equivalent circuit of a flip-flop circuit.
Figure 21:
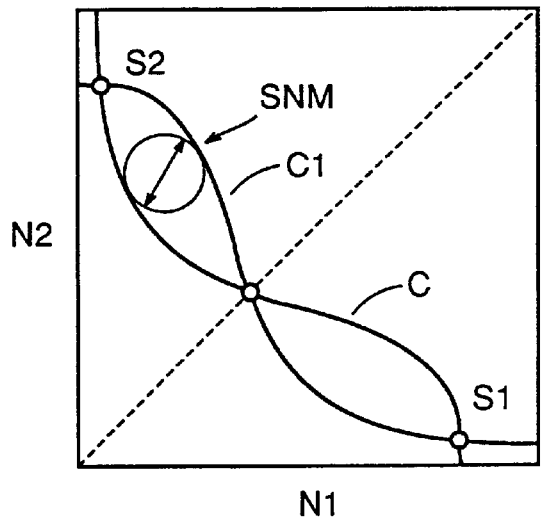
FIG. 21 shows input/output characteristics of a memory cell in an SRAM.
Figure 22:
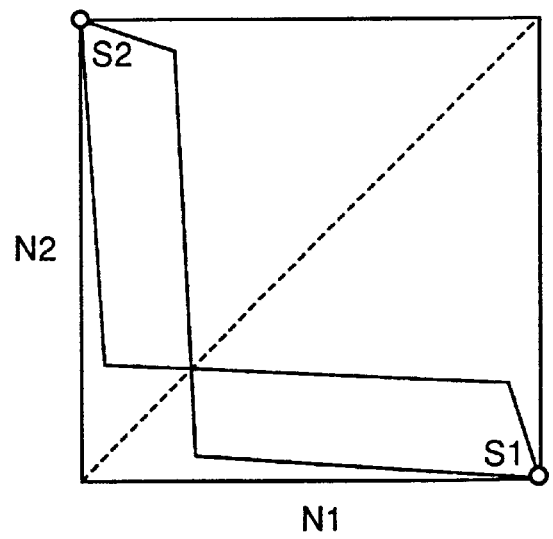
FIGS. 22, 23 and 24 respectively show the input/output characteristics of the memory cell at standby, at data reading, and at data writing.
Figure 23:
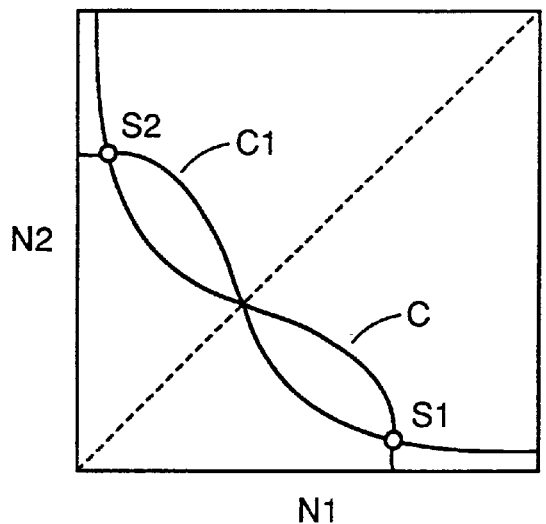
Figure 24:
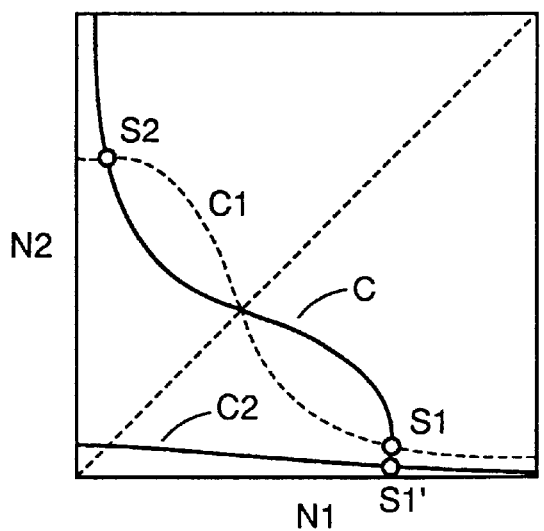

As a semiconductor device according to the first embodiment of the present invention, a semiconductor device having a memory cell in an SRAM will be described with reference to FIGS. 1, 2 and 20A. FIGS. 1 and 2 show respective examples of a cross section and a planar structure of one memory cell in an SRAM, shown as an equivalent circuit in FIG. 20A. FIG. 1 illustrates the sectional structure taken along the line A—A in FIG. 2.

Referring to FIGS. 1 and 2, a p type well 3 is formed on the surface of an n type silicon substrate 1. A word line 5a is formed on the surface of p type well 3 with a gate insulating film 4 interposed therebetween. Word line (gate electrode) 5a has a polycide structure, with a lower layer formed of a polycrystalline silicon polysilicon) film doped with phosphorus, and an upper layer formed of a metal silicide film such as a tungsten silicide film. On the surface of p type well 3, on either side of word line 5a, n⁻ type and n⁺ type drain regions 6a, 8a and n⁻ type and n⁺ type source regions 6b, 8b are formed, respectively. Word line (gate electrode) 5a, n⁻ type and n⁺ type drain regions 6a, 8a and n⁻ type and n⁺ type source regions 6b, 8b form an access transistor A1.

Gate electrodes 5b and 5c are formed on the surface of p type well 3 with gate insulating film 4 interposed therebetween. Similar to word line 5a, gate electrodes 5b and 5c have polycide structures. On the surface of p type well 3, on either side of gate electrode 5b, n⁻ type and n⁺ type drain regions 6b, 8b and n⁻ type and n⁺⁺ type source regions 6c, 10 are formed, respectively. A driver transistor D1 is formed of gate electrode 5b, n⁻ type and n⁺ type drain regions 6b, 8b and n⁻ type and n⁺⁺ type source regions 6c, 10. As shown in FIG. 1, n⁻ type and n⁺ type source regions 6b, 8b of access transistor A1 and n⁻ type and n⁺ type drain regions 6b, 8b of driver transistor D1 are commonly provided.

A silicon oxide film 11 is formed on n type silicon substrate 1 to cover word line (gate electrode) 5a and gate electrode 5b. On silicon oxide film 11, impurity regions doped with phosphorus 12a, 12b and 12c are formed, which are to be channel regions. Formed to cover impurity regions 12a, 12b and 12c is a silicon oxide film 13, on which interconnections 15a and 15b are formed. Interconnection 15b, silicon oxide film 13 and impurity region 12b constitute a p channel type TFT (Thin Film Transistor) to be a load element L1. The load element has one end electrically connected to n⁻ type and n⁺ type source/drain regions 6b and 8b of driver transistor D1 and access transistor A1, and the other end connected to a power supply.

An interlayer insulating film 16 is formed to cover interconnections 15a and 15b. Formed on interlayer insulating film 16 are bit lines 18a and 18b. For example, bit line 18a is electrically connected to n⁻ type and n⁺ type drain regions 6a, 8a of access transistor A1, through a conductor filled in a bit line contact hole 17a and interconnection 15a. Bit line 18b is electrically connected to the drain region of another access transistor (not shown), through a conductor filled in a bit line contact hole 17b and an interconnection. The semiconductor device according to this embodiment is thus configured.

Figure 3:
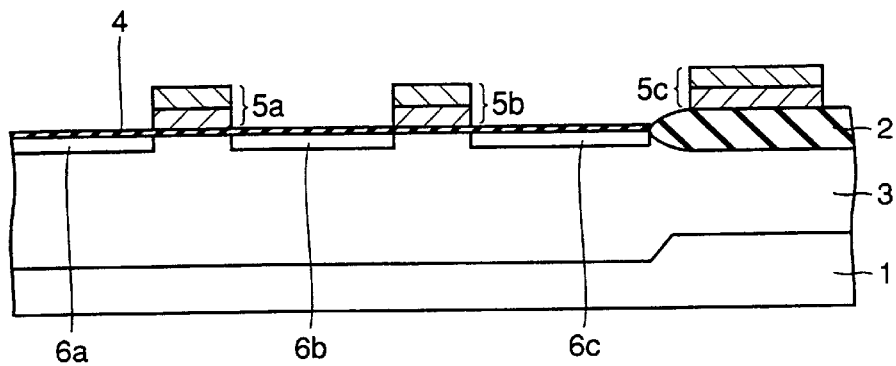
FIGS. 3, 4 and 5 are cross sectional views showing successive steps of a manufacturing method of the semiconductor device shown in FIG. 1.

A manufacturing method of the above-described semiconductor device will now be described. Referring first to FIG. 3, a field insulating film 2 with a film thickness of about 3000 Å is formed of a silicon oxide film on n type silicon substrate 1, with the LOCOS (Local Oxidation of Silicon) method as a way of selective thermal oxidation employing a silicon oxide film and a silicon nitride film. These films used for the thermal oxidation are then removed from the surface of silicon substrate 1. Next, a p type impurity, boron for example, is implanted in the entire surface of n type silicon substrate 1 at implant energy of 200 to 700 KeV, with a dose of $1.0 \times 10^{12}$ to $1.0 \times 10^{13}/cm^2$. A p type impurity such as boron is further implanted at 30 to 70 KeV with a dose of $3.0 \times 10^{12}/cm^2$ to form a p type well 3. The impurity concentration of p type well region 3 thus formed is $1.0 \times 10^{16}$ to $1.0 \times 10^{18}/cm^3$.

Thereafter, a gate insulating film 4 with a film thickness of 40 to 100 Å is formed of a silicon oxide film by thermal oxidation. On gate insulating film 4, a polysilicon film doped with phosphorus (not shown) having a film thickness of about 1000 Å and the phosphorus concentration of about $1.0 \times 10^{20}$ to about $8.0 \times 10^{20}/cm^3$ is formed by the LPCVD (Low Pressure Chemical Vapor Deposition) method applying a gas such as phosphine ($PH_3$). A tungsten silicide film (not shown) is formed on the polysilicon film.

A prescribed photoresist (not shown) is then patterned on the tungsten silicide film by photolithography. Using the photoresist as a mask, the tungsten silicide film and the polysilicon film are then subjected to the RIE (Reactive Ion Etching), and thus a word line 5a and gate electrodes 5b, 5c are formed.

Although word line 5a and gate electrodes 5b, 5c each have been implemented to have a polycide structure including a tungsten silicide film and a polysilicon film doped with phosphorus, they may each have, instead, a structure only with a polysilicon film doped with phosphorus.

Thereafter, in the entire surface of silicon substrate 1, arsenic, for example, is introduced by rotational oblique ion implantation with an implant angle of 45°, at implant energy of 30 to 70 KeV with a dose of $1.0 \times 10^{13}$ to $5.0 \times 10^{13}/cm^2$. An n⁻ type drain region 6a, an n⁻ type source/drain region 6b, and an n⁻ type source region 6c are thus formed, respectively, in regions except for the regions blocked by word line 5a and gate electrodes 5b, 5c. N⁻ type source/drain regions 6a, 6b and 6c thus formed have the impurity concentration of the order of $1.0 \times 10^{17}$ to $1.0 \times 10^{19}/cm^3$.

Figure 4:
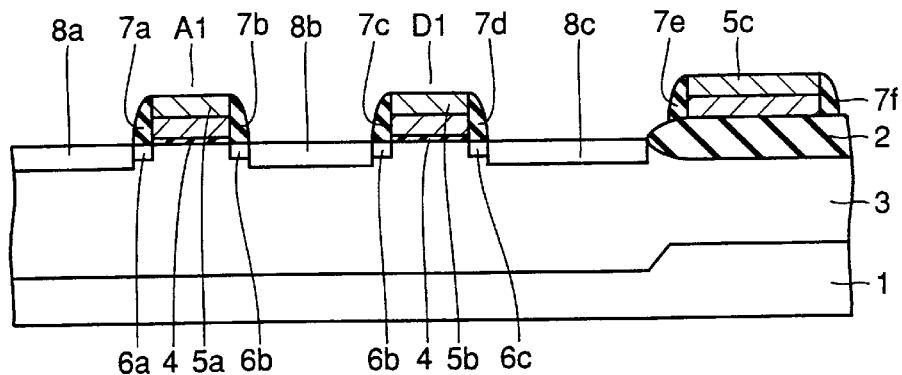

Next with reference to FIG. 4, to cover word line 5a and gate electrodes 5b, 5c, a silicon oxide film (not shown) with a film thickness of 500 to 1500 Å is formed on silicon substrate 1 by the LPCVD. The silicon oxide film is then etched by the RIE, whereby respective sidewall oxide films 7a–7f each with a width of 500 to 1500 Å are formed on either sidewall surface of word line 5a and gate electrodes 5b, 5c.

Thereafter, in the entire surface of silicon substrate 1, arsenic, for example, is implanted at 30 to 70 KeV with a dose of $1.0 \times 10^{15}$ to $5.0 \times 10^{15}/cm^2$, whereby an n⁺ type drain region 8a, an n⁺ type source/drain region 8b, and an n⁺ type source region 8c are respectively formed in regions other than the regions blocked by word line 5a, gate electrodes 5b, 5c and sidewall oxide films 7a–7f. Thus formed n⁺ type source/drain regions 8a, 8b and 8c have the impurity concentration of $10 \times 10^{20}$ to $10 \times 10^{21}/cm^3$ and are 0.05 to 0.15 μm deep.

Figure 5:
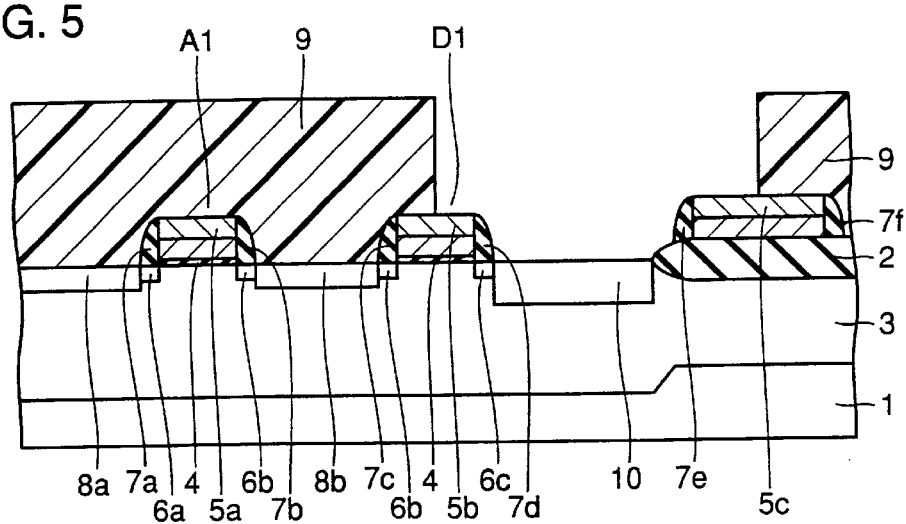

Next with reference to FIG. 5, a photoresist 9 is formed, which exposes the surface of n⁺ type source region 8c shown in FIG. 4. Using this photoresist 9 as a mask, arsenic is implanted at implant energy of 50 to 100 KeV with a dose of $1.0 \times 10^{15}$ to $5.0 \times 10^{15}/cm^2$ to form an n⁺⁺ type source region 10. Thus formed n⁺⁺ type source region 10 has a higher impurity concentration, $5 \times 10^{20}$ to $1 \times 10^{22}/cm^3$, as well as a greater depth, 0.10 to 0.25 μm, than n⁺ type source/drain regions 8a, 8b and 8c.

Figure 6:
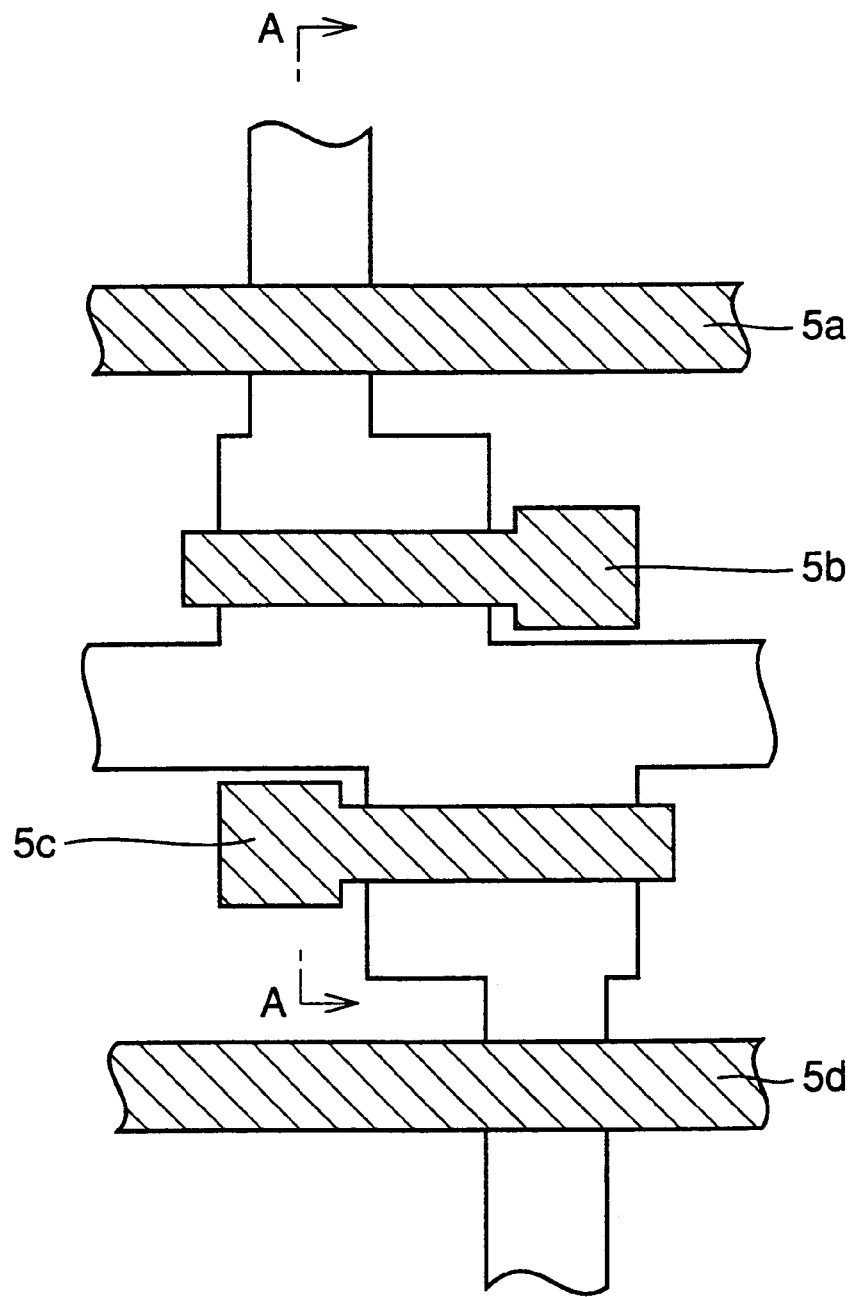
FIG. 6 is a top plan view illustrating the manufacturing step shown in FIG. 5.
Figure 7:
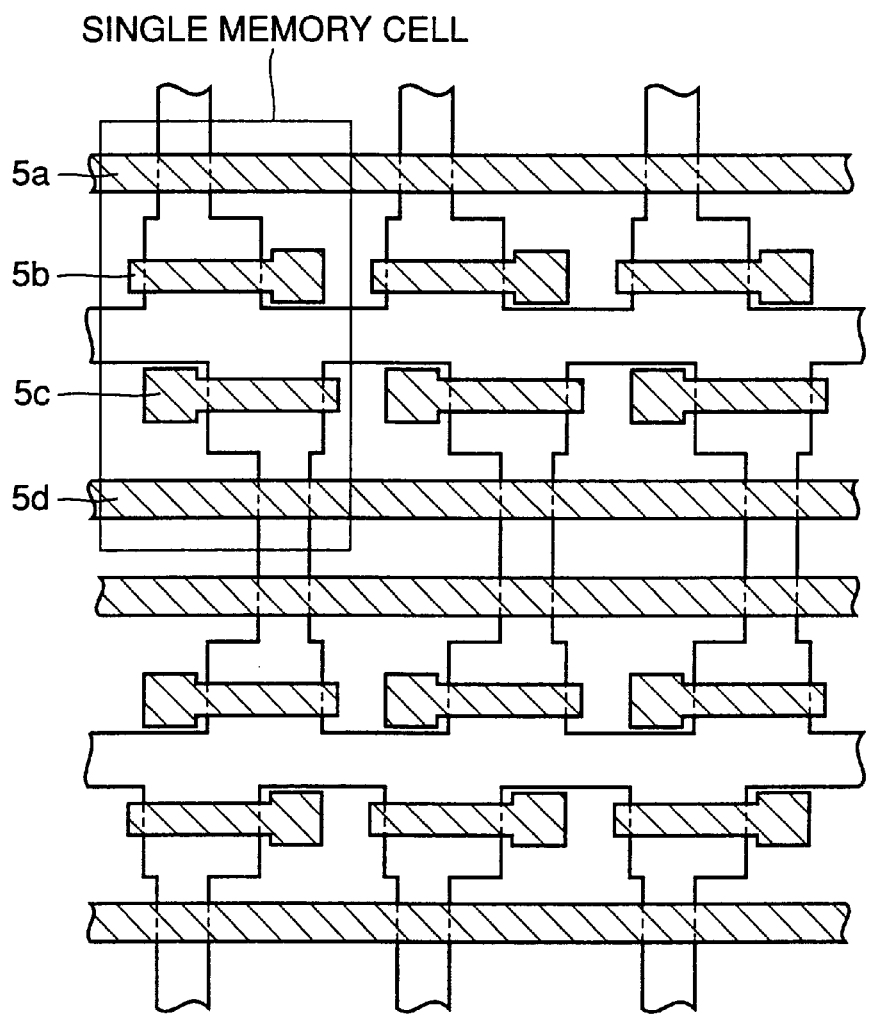
FIG. 7 is a top plan view showing a structure of a plurality of memory cells at the manufacturing step shown in FIG. 5.

Access transistor A1 and driver transistor D1, each with an LDD (Lightly Doped Drain) structure, are thus formed, which relax the electric field in the vicinity of the drain region. Resist 9 is then removed. FIG. 6 shows a planar structure of a single memory cell of an SRAM at this manufacturing step, and FIG. 7 shows a planar structure of 2×3 memory cells at the same step. FIG. 5 specifically shows a sectional structure taken along the line A—A in FIG. 6.

Figure 8:
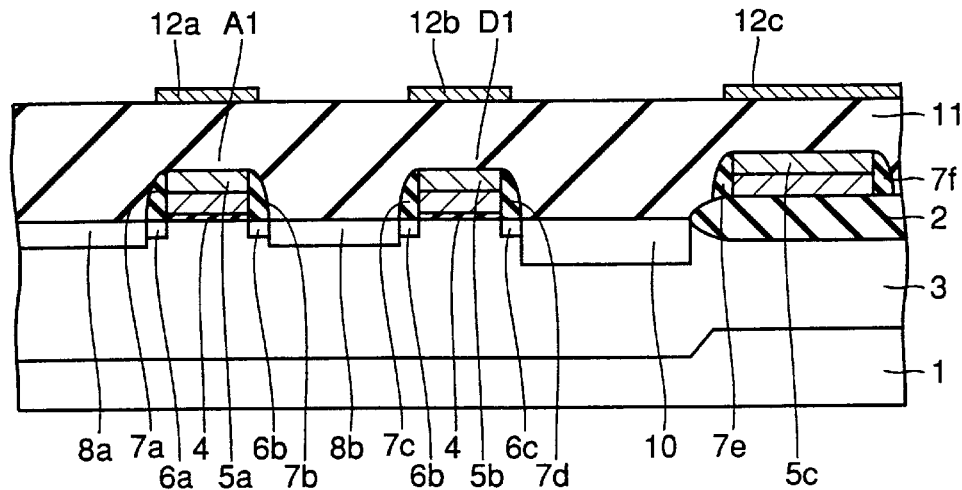
FIG. 8 is a cross sectional view illustrating a manufacturing step following the step shown in FIG. 5.

Now with reference to FIG. 8, a silicon oxide film 11 having a film thickness of 2000 to 10000 Å is formed on silicon substrate 1 by the LPCVD, to cover word line 5a and gate electrodes 5b, 5c. Formed on silicon oxide film 11 by the LPCVD is a polysilicon film with a film thickness of 200 to 1000 Å. Phosphorus is then implanted into the polysilicon film at implant energy of 30 KeV with a dose of $1.0 \times 10^{12}$ to $10 \times 10^{14}/cm^2$.

Figure 9:
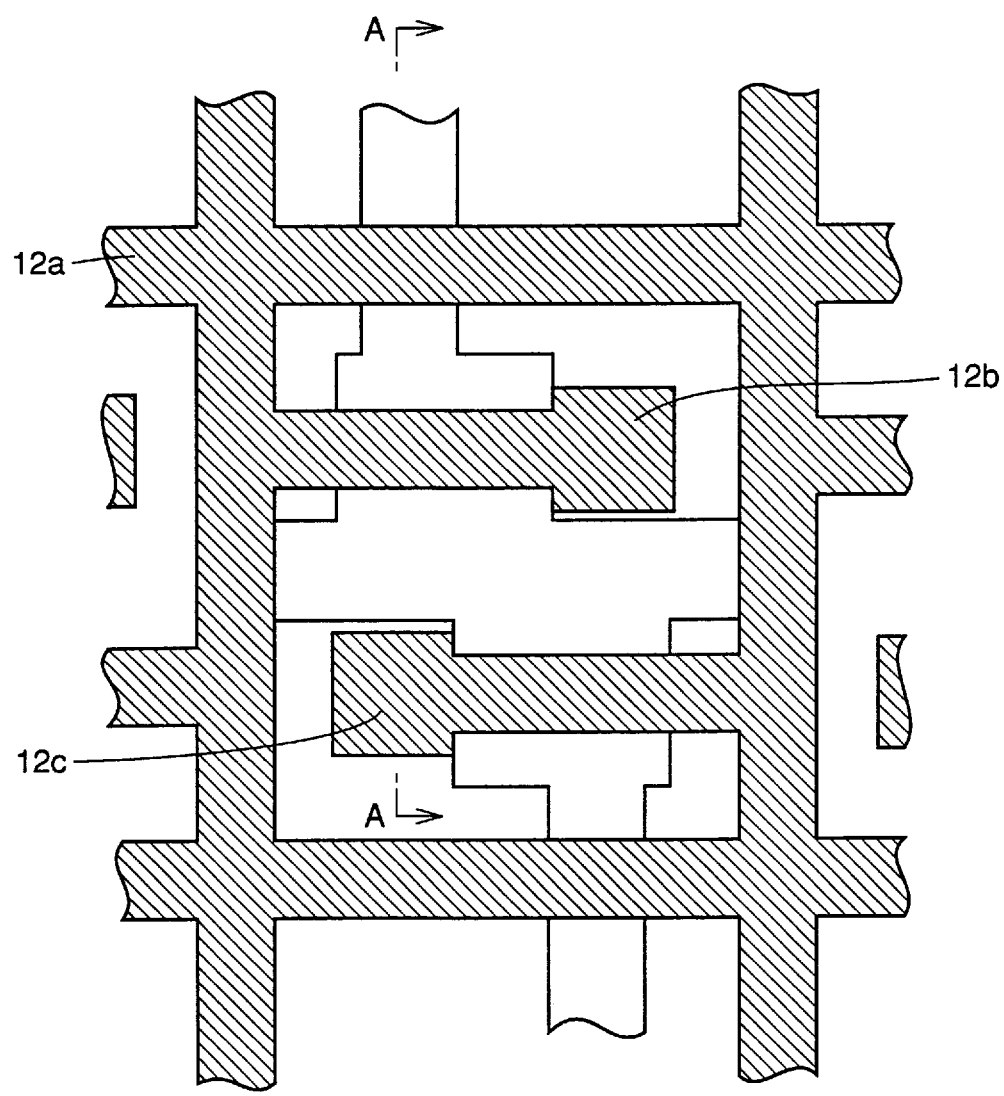
FIG. 9 is a top plan view illustrating the manufacturing step shown in FIG. 8.

Thereafter, on the phosphorus-implanted polysilicon film, a prescribed photoresist pattern (not shown) is formed by photolithography. Using the photoresist pattern as a mask, the polysilicon film is then etched by the RIE, thus forming impurity regions 12a, 12b and 12c, which are to be channel regions. FIG. 9 is a planar structure of the memory cell at this manufacturing step, and FIG. 8 shows a sectional structure taken along the line A—A in FIG. 9.

Figure 10:
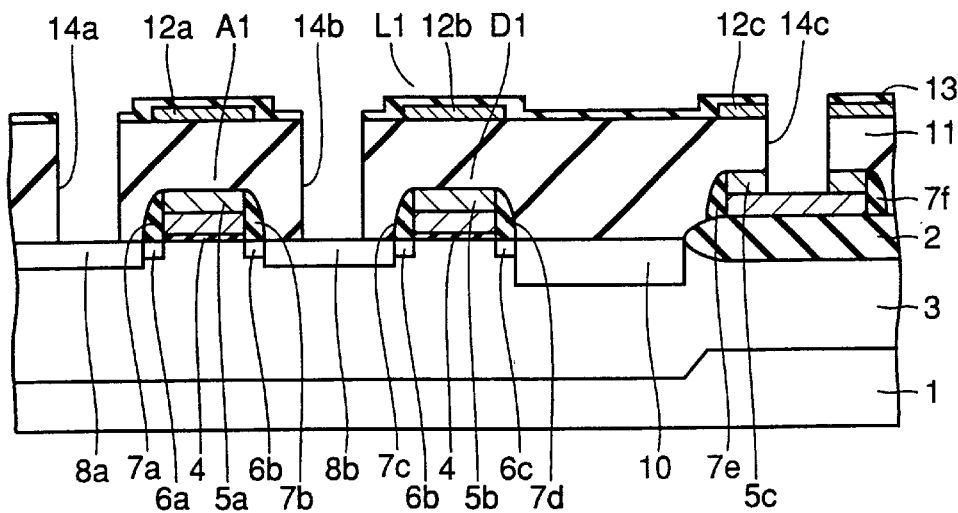
FIG. 10 is a cross sectional view illustrating a manufacturing step following the step shown in FIG. 8.
Figure 11:
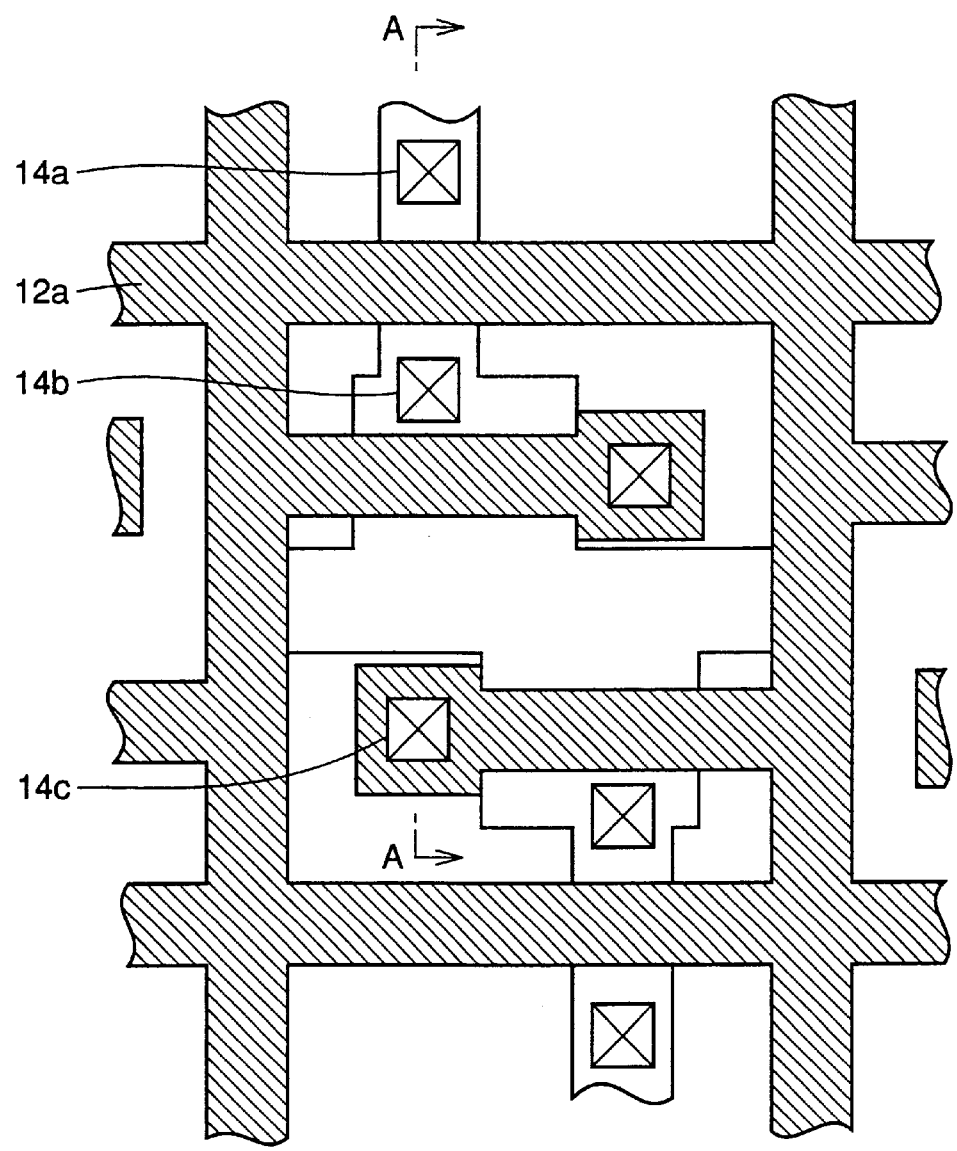
FIG. 11 is a top plan view illustrating the manufacturing step shown in FIG. 10.

Referring to FIG. 10, a silicon oxide film 13, 100 to 300 Å thick, is formed on silicon oxide film 11 by LPCVD, to cover impurity regions 12a, 12b and 12c. A prescribed photoresist pattern (not shown) is then formed on silicon oxide film 13 by photolithography. Using this photoresist pattern as a mask, silicon oxide films 13, 11 etc. are subjected to anisotropic etching, thereby forming contact holes 14a, 14b, and 14c, respectively exposing the surfaces of n⁺ type drain region 8a, n⁺ type source/drain region 8b, and gate electrode 5c. FIG. 11 shows a planar structure of the memory cell at this manufacturing step. FIG. 10 is a sectional structure taken along the line A—A in FIG. 11.

Figure 12:
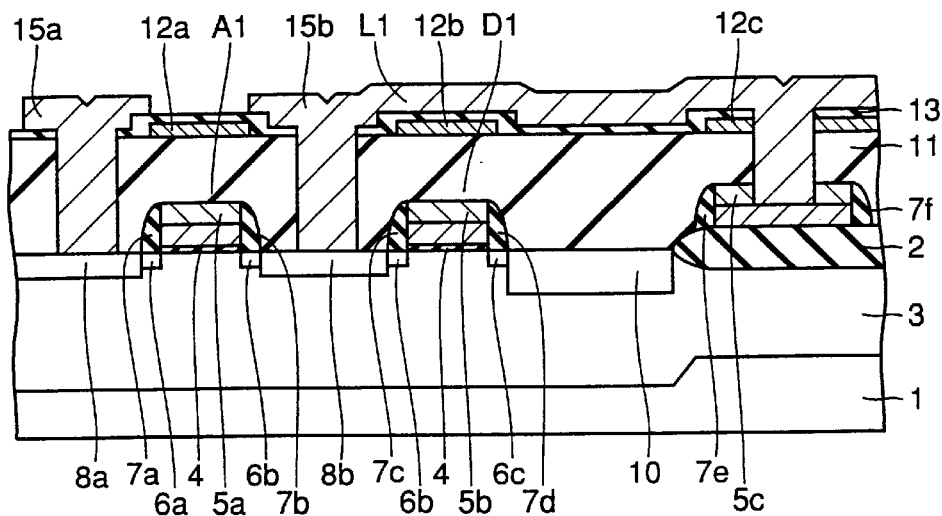
FIG. 12 is a cross sectional view illustrating a manufacturing step following the step shown in FIG. 10.
Figure 13:
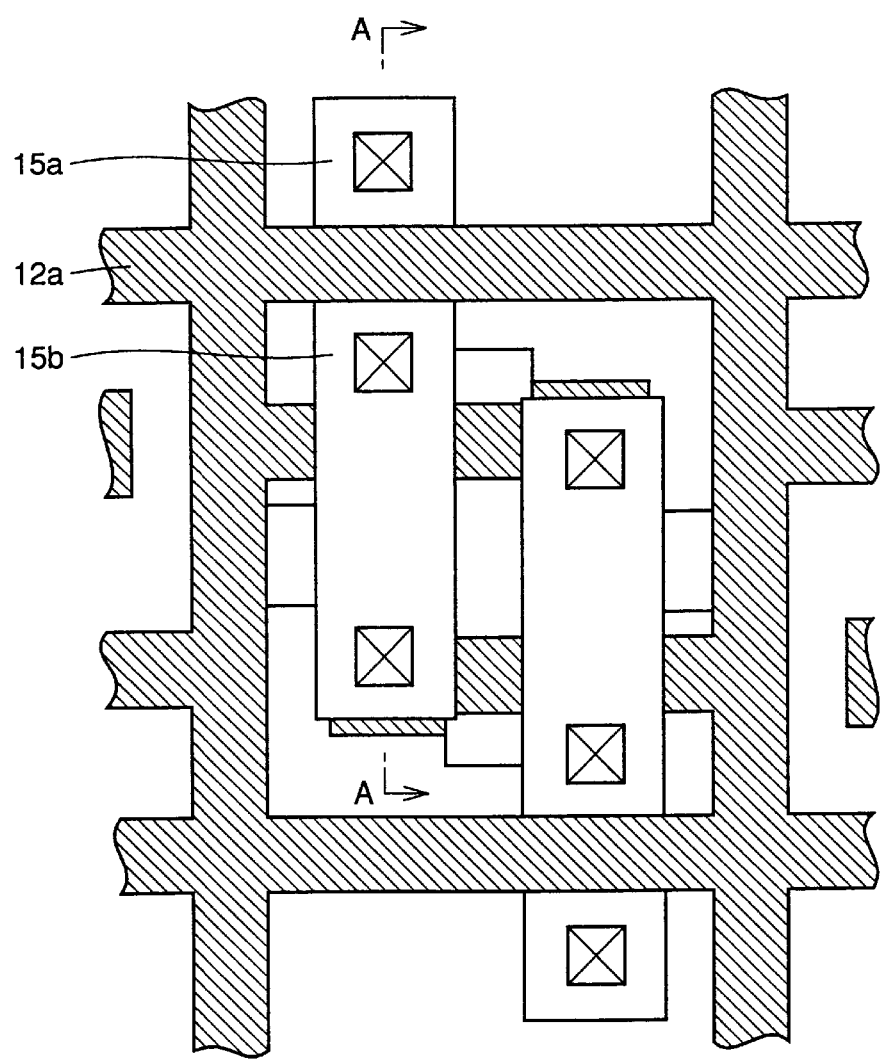
FIG. 13 is a top plan view illustrating the manufacturing step shown in FIG. 12.

Now with reference to FIG. 12, a polysilicon film doped with phosphorus (not shown) is formed on silicon oxide film 13 by the LPCVD to fill in contact holes 14a, 14b, and 14c. The film has a thickness of 1000 to 2000 Å and its phosphorus concentration is $1.0 \times 10^{20}$ to $8.0 \times 10^{20}/cm^3$. A prescribed photoresist pattern (not shown) is then formed on the polysilicon film by photolithography. Using the photoresist pattern as a mask, the phosphorus-doped polysilicon film is etched by the RIE, thereby forming interconnections 15a and 15b. Impurity regions 12b, silicon oxide film 13 and interconnection 15b constitute a p channel type TFT (Thin Film Transistor) as a load element of the memory cell in an SRAM, respectively serving as its channel region, gate insulating film and gate electrode. FIG. 13 shows a planar structure of the memory cell at this manufacturing step, and FIG. 12 is a sectional structure taken along the line A—A in FIG. 13.

Thereafter, an interlayer insulating film 16 is formed to cover interconnections 15a and 15b, and a bit line contact hole as well as a bit line made of an aluminum interconnection are formed in a well-known manner. The semiconductor device shown in FIG. 1 is thus completed.

According to the above-described semiconductor device, n⁺⁺ type source region 10 of driver transistor D1 has a higher impurity concentration than and is formed deeper than n⁻ type and n⁺ type drain regions 6a, 8a, 6b, 8b of access transistor A1. Therefore, it becomes possible to set the threshold voltage of driver transistor D1 higher than that of access transistor A1 owing to a reverse short channel effect.

The reverse short channel effect will now be described. According to a literature (C. S. Rafferty et al.: IEDM Tech. Digest (1993) pp. 311–314), the ion implantation when forming n⁺⁺ type source region 10 and drain regions 6b, 8b for driver transistor D1 causes point defects in silicon substrate 1. The point defects are diffused from n⁺⁺ type source region 10 and drain regions 6b, 8b towards the channel region, which is accompanied by an accelerated diffusion of the impurity (boron) at the channel region of driver transistor D1. At this time, the shorter the gate length of driver transistor D1, the closer n⁺⁺ type source region 10 and drain regions 6b, 8b become, so that excessive point defects are likely to be diffused, and hence will further accelerate the impurity (boron) diffusion. These point defects disappear at the interface of gate insulating film 4 directly below gate electrode 5b and silicon substrate 1, and thus they have in the channel region a concentration gradient with a peak of concentration in the vicinity of the interface. As a result, the impurity (boron) will pileup, or be accumulated, directly below the channel region, causing the threshold voltage of the driver transistor to rise. It is generally known that this phenomenon is especially noticeable when the gate length of a transistor is less than 0.4 μm.

Still according to the semiconductor device as described above, n⁺⁺ type source region 10 in driver transistor D1 has an impurity concentration higher than, and a depth greater than n⁺ type drain regions 6a, 8a, 6b, 8b. N⁺⁺ type source region 10 thus has a reduced resistance, permitting a larger current to flow therethrough. This leads to an improvement of the current drivability of the driver transistor, making larger the β ratio or the ratio of the current drivability of the driver transistor against that of the access transistor. As a result, a larger static noise margin is attained, which ensures the improvement in the stability of the memory cell operation.

Furthermore, drain regions 6b and 8b of driver transistor D1 has a lower impurity concentration than and is formed shallower than n⁺⁺ type source region 10. Therefore, punch through in driver transistor D1 can readily be prevented.

Next, to examine the gate length dependence of the threshold voltages of access transistor A1 and driver transistor D1 of the above-described semiconductor device, two transistors were formed in such a manner as described above, to simulate the access transistor and the driver transistor, respectively. In other words, a transistor with source/drain regions having the same impurity concentration and the same depth as $n^+$ type and $n^+$ type source/drain regions 6b, 8b, 6a and 8a, and the other transistor with a source region having the same impurity concentration and the same depth as $n^-$ type and $n^{++}$ type source regions 6c and 10 as well as a drain region having the same impurity concentration and the same depth as $n^-$ type and $n^+$ type drain regions 6b and 8b were formed.

Figure 14:
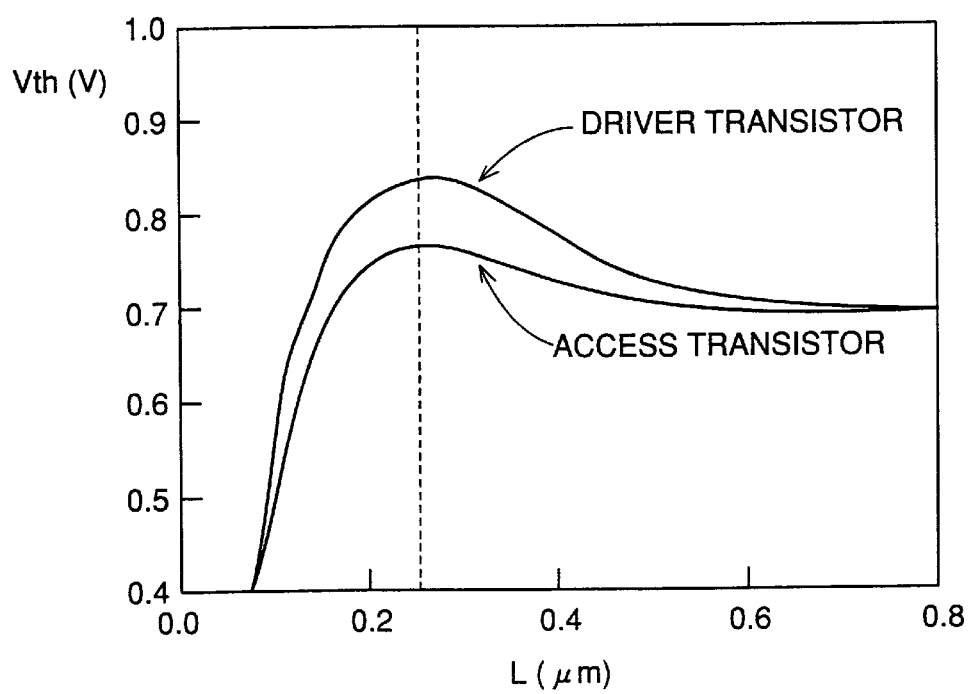
FIG. 14 is a graph showing a gate length dependence of the threshold voltage of each transistor.

FIG. 14 shows the gate length (L) dependence on the threshold voltage (Vth) for these transistors. According to FIG. 14, the threshold voltage of the transistor equivalent to the driver transistor is higher than that of the transistor equivalent to the access transistor due to the reverse short channel effect. For example, when the gate length L is 0.25 μm, the threshold voltage of the transistor equivalent to the driver transistor is 0.83 V, whereas the threshold voltage of the transistor equivalent to the access transistor is 0.75 V.

As a result, the static noise margin of the memory cell in an SRAM is improved, ensuring stable operation of the memory cell.

In the semiconductor device as described above, it is unnecessary to selectively introduce an impurity into the silicon substrate directly below its gate electrode for the purpose of controlling the threshold voltage of a driver transistor, for example. Therefore, any additional process step is unnecessary, and thus, the manufacturing cost can be prevented from increasing.

Second Embodiment

Figure 15:
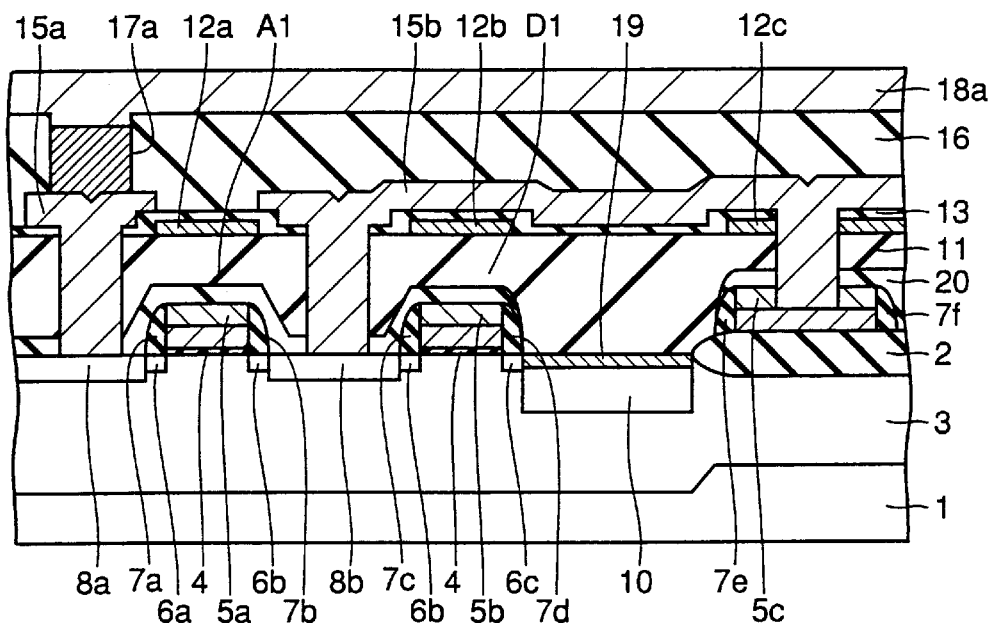
FIG. 15 is a cross sectional view of a semiconductor device according to a second embodiment of the present invention.

A semiconductor device according to the second embodiment of the present invention will be described with reference to the drawings. Referring to FIG. 15, a titanium silicide film 19 is formed on $n^{++}$ type source region 10 of driver transistor D1. A silicon oxide film 20 is formed to cover word line 5a and gate electrodes 5b, 5c. Except for that, the semiconductor device according to this embodiment has the same configuration as that according to the first embodiment as shown in FIG. 1. Accordingly, corresponding parts are denoted by same reference numerals and their descriptions will not be repeated.

Figure 16:
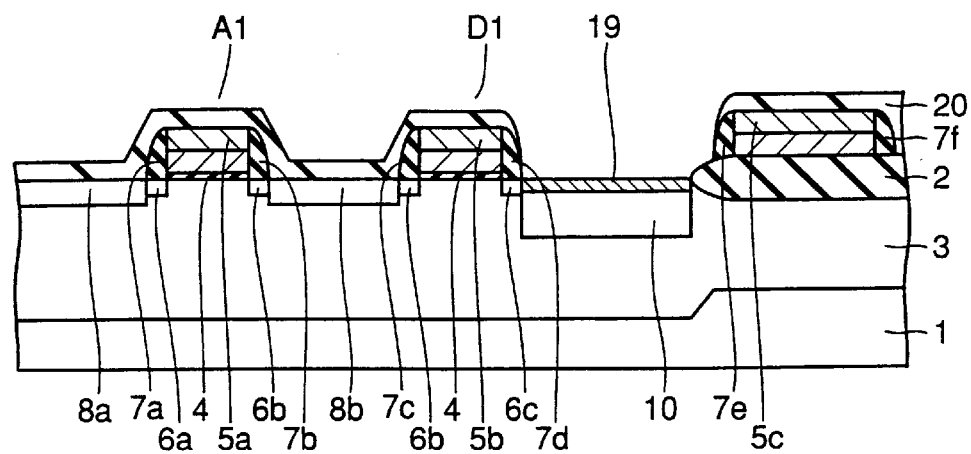
FIG. 16 is a cross sectional view illustrating a step of manufacturing method of the semiconductor device shown in FIG. 15.

A manufacturing method of the above-described semiconductor device will now be described with reference to the drawings. Referring to FIG. 16, up to the formation of $n^+$ type drain region 8a, $n^+$ type drain region 8b and $n^+$ type source region 8c (not shown), the semiconductor device according to this embodiment is formed with the same manufacturing steps as employed in the first embodiment, as described with reference to FIGS. 3 and 4. Thereafter, a silicon oxide film (not shown) with a film thickness of 300 to 1000 Å is formed on silicon substrate 1 by the LPCVD, to cover word line 5a and gate electrodes 5b, 5c, etc. The silicon oxide film on $n^+$ type source region 8c of driver transistor D1 is then selectively removed by photolithography and the RIE. A silicon oxide film 20 is thus formed.

Thereafter, an $n^{++}$ type source region 10 of driver transistor D1 is formed employing the same method as described with reference to FIG. 5. A titanium film about 300 Å thick is then formed on silicon oxide film 20 by sputtering, to cover $n^{++}$ type source region 10. Thereafter, RTA (Rapid Thermal Annealing) is performed at a temperature in the range of 700 to 800° C. for one minute, for example, whereby a titanium silicide film 19 is selectively formed only on $n^{++}$ type source region 10 of driver transistor D1. The titanium film left on silicon oxide film 20 is then removed using sulfuric oxide, for example. The RTA is then performed again at a temperature of 700 to 900° C. for about one minute.

Figure 17:
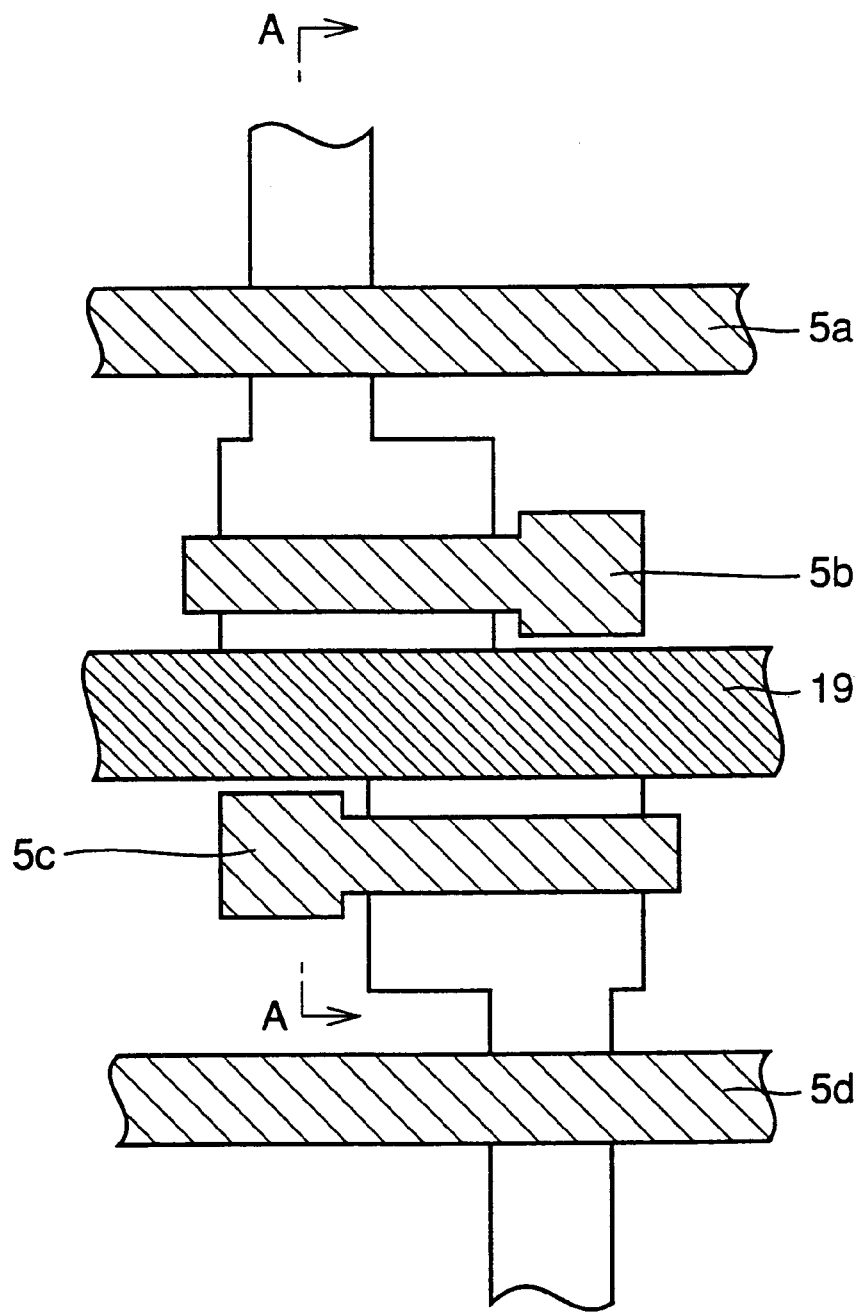
FIG. 17 is a top plan view of the semiconductor device at the manufacturing step shown in FIG. 16.

Titanium silicide film 19 thus formed has a sheet resistance of 5 to 10 Ω/sq. Although the titanium silicide film has been formed as a metal silicide film, alternatively, other refractory metal silicide films such as a cobalt silicide film or a nickel silicide film may also be used. FIG. 17 is a planer structure of the memory cell at this manufacturing step. FIG. 16 is a sectional structure taken along the line A—A in FIG. 17. Thereafter, the semiconductor device shown in FIG. 15 is completed by employing the same manufacturing steps as described in the first embodiment and as shown in FIGS. 8 through 12.

In this semiconductor device, titanium silicide film 19 is formed only on $n^{++}$ type source region 10 of driver transistor D1. As seen in the equivalent circuit of FIG. 20A, the $n^{++}$ type source region 10 is connected to the ground. This offers, in addition to the effects as described in the first embodiment, the following effects. Namely, the resistance at the interconnection on the grounded side of driver transistor D1 is further lowered so that the ground potential is made stable, and the current drivability of driver transistor D1 is increased so that the β ratio is increased accordingly. As a result, a still larger static noise margin is attained, ensuring more stable operation of the memory cell.

According to this embodiment, in addition to $n^{++}$ type source region 10 of driver transistor D1 connected to the ground, p type well 3 is also held at a potential on the grounded side, and thus no potential difference arises between $n^{++}$ type source region 10 and p type well 3. Accordingly, a junction leakage current can be prevented from flowing between these two regions.

Further, in the semiconductor device according to this embodiment, compared to the semiconductor device in which $n^{++}$ type source region 10 has not been formed and a titanium silicide film has been formed on $n^+$ type source region 8c, titanium silicide film 9 formed on $n^{++}$ type source region 10 prevents excessive diffusion of arsenic from the source region into the titanium silicide film, and hence efficiently prevents the rise of a connection resistance between the titanium silicide film and the source region.

Note that titanium silicide film 9 is formed only on $n^{++}$ type source region 10. If it is also formed, for example, on $n^+$ type drain region 8a of access transistor A1, a junction leakage current will flow from the $n^+$ type drain region 8 to p type well 3 when a bit line attains a high level, which leads to increased current consumption. Therefore, titanium silicide film 9 is desirably formed only on $n^{++}$ type source region 10.

Third Embodiment

Figure 18:
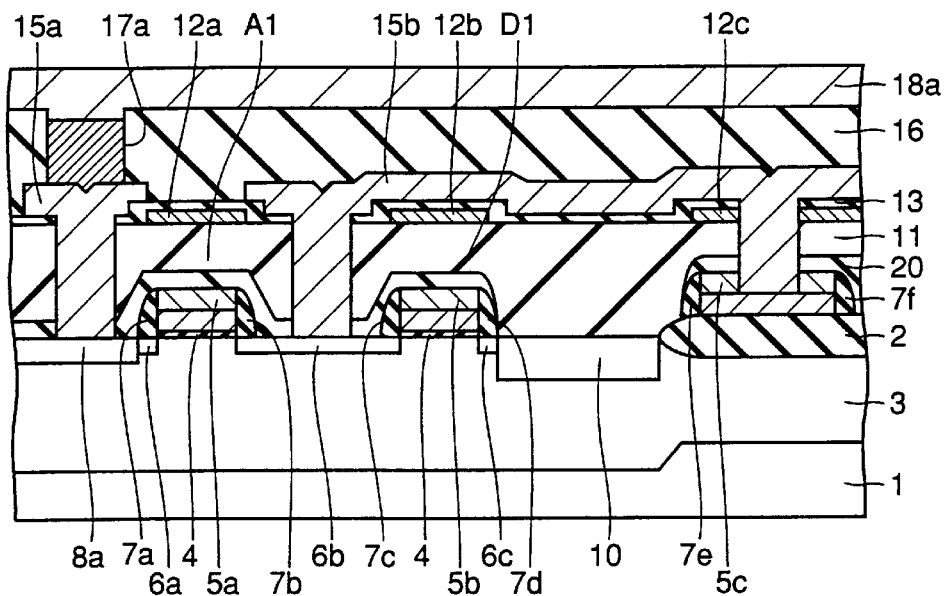
FIGS. 18 and 19 are cross sectional views of semiconductor devices according to third and fourth embodiments of the present invention.

A semiconductor device according to the third embodiment of the present invention will be described with reference to the drawings. Referring to FIG. 18, driver transistor D1 has only $n^-$ type drain region 6b as its drain region, and access transistor A1 has only $n^-$ type source region 6b (common) as its source region. Except for that, the semiconductor device according to this embodiment has the same configuration as that according to the first embodiment as described with reference to FIG. 1, so that the same parts are denoted by the same reference numerals and their descriptions will not be repeated.

The semiconductor device according to this embodiment can be made employing the same manufacturing steps as described in the first embodiment, except that $n^+$ type source/drain region 8b is not formed at the manufacturing step shown in FIG. 4 as in the first embodiment.

According to the above-described semiconductor device, access transistor A1 has only n⁻ type source region 6b as its source region. Accordingly, the amount of a current flowing through the source region of access transistor A1 is reduced, and the current drivability of the access transistor A1 is thus lowered. This offers, in addition to those as described in the first embodiment, an additional effect that the β ratio can further be increased, and as a result, the static noise margin of the memory cell is further improved. Therefore, more stable operation of the memory cell is guaranteed.

Fourth Embodiment

Figure 19:
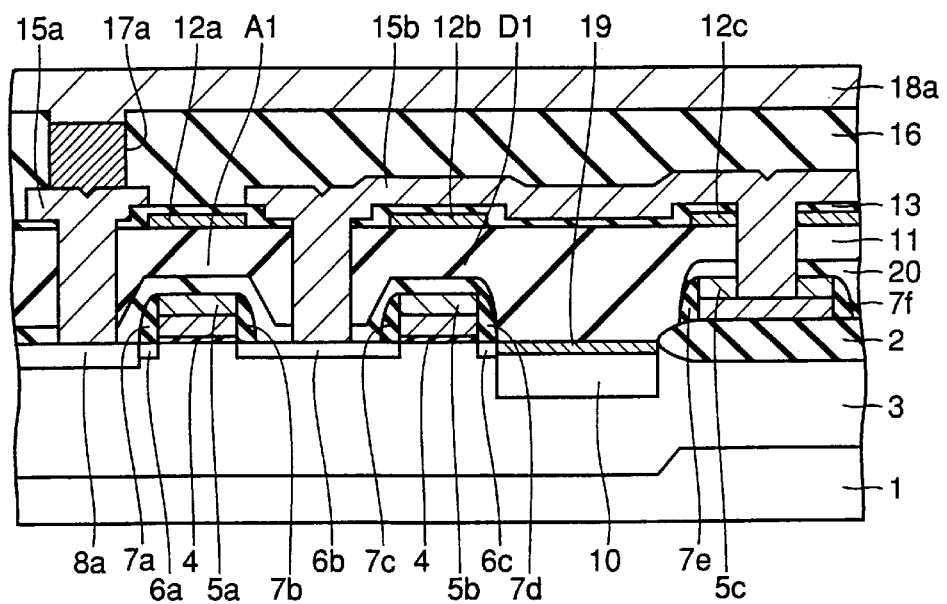

A semiconductor device according to the fourth embodiment of the present invention will now be described with reference to drawings. Referring to FIG. 19, driver transistor D1 has only n⁻ type drain region 6b as its drain region, and access transistor A1 has only n⁻ type source region 6b (common) as its source region. Except for that, the semiconductor device according to this embodiment has the same configuration as that according to the second embodiment as shown in FIG. 15. Therefore, the same parts are denoted by the same reference numerals and their descriptions will not be repeated.

The semiconductor device according to this embodiment can be implemented through the same manufacturing steps as described in the first and second embodiments, except that n⁺ type source/drain region 8b is not formed at the manufacturing step shown in FIG. 4 as described in the first embodiment.

In the semiconductor device as described above, access transistor A1 has only n⁻ type source region 6b as its source region. It means that a current flowing through n⁻ type source region 6b is reduced in amount, which results in the decreased current drivability of access transistor A1. Accordingly, the semiconductor device according to this embodiment not only offers the effects as described in the second embodiment, but also increases the β ratio, which is similar to the semiconductor device according to the third embodiment. As a result, the static noise margin of the memory cell is further improved, whereby more stable operation of the memory cell is ensured.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:

a first conductivity type region formed on a main surface of a semiconductor substrate;

a first gate electrode and a second gate electrode, each formed on a surface of said first conductivity type region and spaced apart from each other;

a gate insulating film formed between the semiconductor substrate and the first gate electrode and also between the semiconductor substrate and the second gate electrode;

a first impurity region formed on the surface of said first conductivity type region immediately beneath a sidewall of said first gate electrode which faces away from said second gate electrode, said first impurity region being of a second conductivity type having a first impurity concentration;

a second impurity region formed on the surface of said first conductivity type region at least at a region immediately beneath a sidewall of said first gate electrode which faces said second gate electrode and at a region immediately beneath a sidewall of said second gate electrode which faces said first gate electrode, said second impurity region being of the second conductivity type and having said first impurity concentration;

a third impurity region of the second conductivity type having said first impurity concentration, formed on the surface of said first conductivity type region immediately beneath a sidewall of said second gate electrode which faces away from said first gate electrode;

a fourth impurity region formed on the surface of said first conductivity type region and adjacent said third impurity region, said fourth impurity region having a depth that is greater than a depth of said third impurity region, being of the second conductivity type and having a second impurity concentration that is higher than said first impurity concentration; and a fifth impurity region formed on the surface of said first conductivity type region and adjacent said first impurity region, said fifth impurity region having a depth that is greater than that of both the first impurity region and the fourth impurity region, being of the second conductivity type and having a third impurity concentration that is higher than said second impurity concentration.

2. The semiconductor device according to claim 1, comprising a conductive layer formed only on the surface of said fifth impurity region.

3. The semiconductor device according to claim 2, wherein said conductive layer is a metal silicide film.

4. The semiconductor device according to claim 3, comprising a static memory cell including a flip-flop circuit formed of a pair of driver transistors with their gates and drains cross-coupled and a load element connected between a drain of each driver transistor and a power supply, and an access transistor connected between a drain of each driver transistor and a pair of bit lines, and having a gate connected to a word line, a drain region of said access transistor being said third and fourth impurity regions, a source region of said access transistor including said second impurity region, a gate of said access transistor being said second gate electrode, a drain region of said driver transistor including said second impurity region, a source region of said driver transistor being said first and fifth impurity regions, and a gate of said driver transistor being said first gate electrode.

5. The semiconductor device according to claim 2, comprising a static memory cell including a flip-flop circuit formed of a pair of driver transistors with their gates and drains cross-coupled and a load element connected between a drain of each driver transistor and a power supply, and an access transistor connected between a drain of each driver transistor and a pair of bit lines, and having a gate connected to a word line, a drain region of said access transistor being said third and fourth impurity regions, a source region of said access transistor including said second impurity region, a gate of said access transistor being said second gate electrode, a drain region of said driver transistor including said second impurity region, a source region of said driver transistor being said first and fifth impurity regions, and a gate of said driver transistor being said first gate electrode.

6. The semiconductor device according to claim 1, comprising a static memory cell including a flip-flop circuit formed of a pair of driver transistors with their gates and drains cross-coupled and a load element connected between a drain of each driver transistor and a power supply, and an access transistor connected between a drain of each driver transistor and a pair of bit lines, and having a gate connected to a word line, a drain region of said access transistor being said third and fourth impurity regions, a source region of said access transistor including said second impurity region, a gate of said access transistor being said second gate electrode, a drain region of said driver transistor including said second impurity region, a source region of said driver transistor being said first and fifth impurity regions, and a gate of said driver transistor being said first gate electrode.

7. The semiconductor device according to claim 1, comprising:

a sixth impurity region formed on the surface of said first conductivity type region between said first gate electrode and said second gate electrode, and in contact with both said second impurity region formed beneath the sidewall of said first gate electrode and said second impurity region formed beneath the sidewall of said second gate electrode, said sixth impurity region having a depth that is greater than the depth of said second impurity region and less than the depth of said fifth impurity region, and said sixth impurity region being of the second conductivity type and having a fourth impurity concentration that is higher than said first impurity concentration and lower than said third impurity concentration.

8. The semiconductor device according to claim 7, comprising a static memory cell including a flip-flop circuit formed of a pair of driver transistors with their gates and drains cross-coupled and a load element connected between a drain of each driver transistor and a power supply, and an access transistor connected between a drain of each driver transistor and a pair of bit lines, and having a gate connected to a word line, a drain region of said access transistor being said third and fourth impurity regions, a source region of said access transistor including said second impurity region, a gate of said access transistor being said second gate electrode, a drain region of said driver transistor including said second impurity region, a source region of said driver transistor being said first and fifth impurity regions, and a gate of said driver transistor being said first gate electrode.

* * * * *